United States Patent [19]

Tomooka

[11] 4,435,825
[45] Mar. 6, 1984

[54] CLOCK SIGNAL EXTRACTING CIRCUIT

[75] Inventor: Keiji Tomooka, Yokohama, Japan

[73] Assignee: Hitachi, Ltd., Tokyo, Japan

[21] Appl. No.: 352,379

[22] Filed: Feb. 25, 1982

[30] Foreign Application Priority Data

Feb. 27, 1981 [JP] Japan ................................ 56-26956

[51] Int. Cl.³ .............................................. H04L 7/04
[52] U.S. Cl. ..................................... 375/113; 375/12;
375/81; 329/122
[58] Field of Search ..................... 375/80, 81, 82, 113,
375/118, 119, 120, 96, 97, 12, 14; 328/110, 151;
333/118; 329/104, 110, 122

[56] References Cited

U.S. PATENT DOCUMENTS 3,557,308  1/1971  Alexander ............................ 375/120
3,701,948  10/1972  McAuliffe ............................ 375/94
3,943,448  3/1976  Motley et al. ........................ 375/14
4,312,075  1/1982  Murano et al. ...................... 375/113

Primary Examiner—Robert L. Griffin
Assistant Examiner—Stephen Chin
Attorney, Agent, or Firm—Antonelli, Terry & Wands

[57] ABSTRACT

A clock extractor is disclosed in which an input data signal is sampled and held in accordance with a sampling frequency, the input data signal thus processed is subjected to equalization and amplification, a difference in voltage (namely, height) is detected between those portions of a waveform obtained after the equalization and amplification which appear before and after a time when the waveform has a maximum voltage amplitude, a phase of that portion of the waveform which has the maximum voltage amplitude, is determined by making the above-mentioned difference equal to zero, and a clock signal synchronized with the portion having the maximum voltage amplitude is extracted and reproduced from the input data signal.

6 Claims, 9 Drawing Figures

CLOCK SIGNAL EXTRACTING CIRCUIT

BACKGROUND OF THE INVENTION

The present invention relates to a clock signal exracting circuit for extracting and reproducing a clock signal from an inputted data signal, and more particularly to a clock signal extracting circuit for extracting a peak point of the data signal to extract and reproduce a timing clock signal by a waveform portion comparing method in which a pair of finite differences in a waveform are compared with each other.

In conventional clock signal extracting circuits, a fundamental frequency component contained in an input data signal is extracted by making use of, for example, a predetermined characteristic of a low-pass filter or a resonance characteristic of a resonance circuit, and a clock signal is reproduced from the extracted fundamental frequency component.

Such conventional circuits, however, are required to include a number of accurate, stable inductors and capacitors which scarcely degrade with temperature and time, since the low-pass filter or resonance circuit must have a sharp selection characteristic. Further, it is required in the conventional clock signal extracting circuits to be able to adjust the frequency and phase characteristics thereof.

Accordingly, it has been difficult to obtain an economical clock signal extracting circuit. Further, the characteristic of a conventional clock signal extracting circuit has degraded greatly with temperature and time. Furthermore, it has been difficult to fabricate a conventional clock signal extracting circuit in the form of an integrated circuit, since the conventional circuit includes a number of coil parts (namely, inductors).

SUMMARY OF THE INVENTION

It is accordingly an object of the present invention to provide a clock signal extracting circuit which can eliminate the drawbacks of conventional circuits, which is economical and can be made small in size, and whose characteristic is not degraded.

In order to attain the above object, according to an aspect of the present invention, there is provided a clock signal extracting circuit in which an input data signal is sampled and held in accordance with a predetermined sampling frequency to produce a discrete signal having a steplike waveform, the discrete signal thus obtained is subjected to equalization and amplification, a difference in amplitude is detected between those portions of the steplike discrete signal which appear on both sides of the steplike portion of the discrete signal corresponding to the maximum amplitude of the input data signal, the sampling frequency is controlled by the detected amplitude difference so that the amplitude difference is equal to zero thereby to determine a phase at which the input data signal has a maximum amplitude, and a clock signal phase-synchronized with the determined phase is extracted and reproduced from the steplike waveform obtained after the equalization and amplification.

BRIEF DESCRIPTION OF THE DRAWINGS

The present invention will become more apparent from the following detailed description taken in conjunction with the accompanying drawings, in which.

DETAILED DESCRIPTION OF THE PREFERRED EMBODIMENT

Now, an embodiment of the present invention will be explained in detail, with reference to the drawings.

Figure 1:
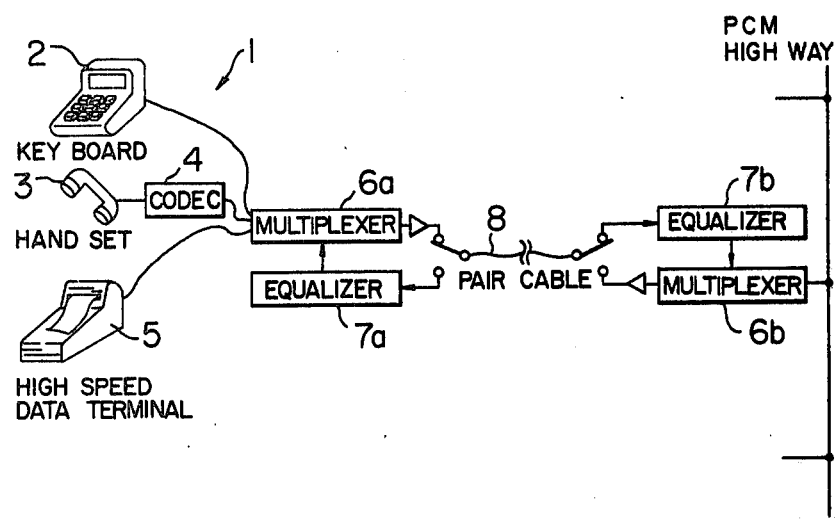
FIG. 1 is a schematic diagram of a digital telephone system, to which the present invention is applied.

FIG. 1 shows an outline of a digital telephone system which is provided with a clock signal extracting circuit according to the present invention. Referring to FIG. 1, a subscriber terminal 1 is made up of a key board 2, a hand set 3, a codec 4, and a high speed data terminal 5. Further, between the subscriber terminal 1 and a PCM high way are provided multiplexer units 6a and 6b, equalizer units 7a and 7b and a paired cable 8 connected between the multiplexer units 6a and 6b and the equalizer units 7a and 7b. Thus, a data signal is bidirectionally transmitted through the paired cable 8 in a time division multiplex fashion. A data signal containing an audio signal and data (which are transmitted and received at rates of 64 .kb/s and 16 kb/s, respectively,) is compressed to about one-half of an original value, and thus a burst-type signal having a code transmission rate of 176 kilobaud is obtained. In a burst system in which, as mentioned above, transmitting and receiving cycles take place alternately, no timing information nor amplitude information is obtained for more than one-half of a period during which transmission is performed. Accordingly, it is required in the burst system to hold a clock signal when the data is zero, or for a burst-off period (namely, a transmitting period).

Figure 2:
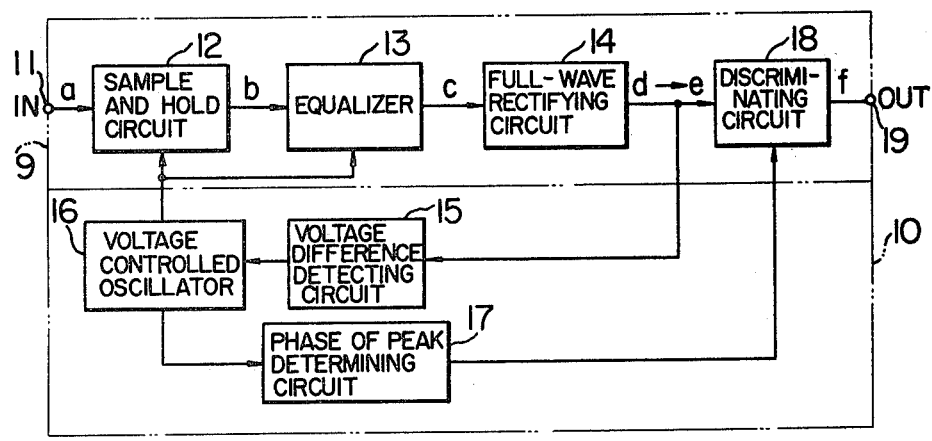
FIG. 2 is a block diagram showing an embodiment of a clock signal extracting circuit according to the present invention.

FIG. 2 shows an embodiment of a clock signal extracting circuit according to the present invention, which is included in each of the equalizer units 7a and 7b, and is made up of a clock signal extracting/reproducing part 9, and an equalizing, discriminating and reproducing part 10 for reproducing data in cooperation with the clock extracting/reproducing part 9. In FIG. 2, reference numeral 11 designates an input terminal (IN) to which is applied a data signal, 12 a sample and hold circuit, 13 an equalizer controlled by sampled values, 14 a full-wave rectifying circuit, 15 a voltage difference detecting circuit, 16 a voltage controlled oscillator, 17 a phase-of-peak determining circuit, 18 a discriminating circuit, and 19 an output terminal (OUT) for outputting a reproduced clock signal.

Further, waveforms shown in FIGS. 3a to 3f are obtained at positions a to f shown in FIG. 2, respectively.

Now, the operation of the embodiment shown in FIG. 2 will be explained, with reference to FIGS. 3a to 3f, which relate to waveforms corresponding to the data in bipolar code transmission.

Figure 3A:
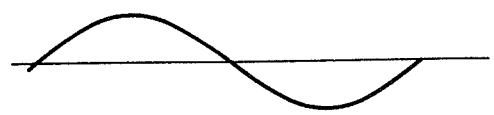
FIGS. 3a to 3f are waveform charts for explaining the operation of the embodiment shown in FIG. 2.

A data signal applied to the input terminal 11 has a waveform as shown in FIG. 3a, due to an attenuation distortion occurring at the transmission line.

The waveform shown in FIG. 3a is imputted to the sample and hold circuit 12 to be sampled and held in accordance with a sampling frequency supplied from the voltage controlled oscillator 16. Thus, a discrete signal having a waveform such as shown in FIG. 3b is outputted from the sample and hold circuit 12.

The sampling frequency is made about N times higher than the clock frequency with respect to the input data signal. (In the present embodiment, N is equal to 4.) The value of N may be selected from values exceeding 2 (two), according to the convenience of design.

Figure 3B:
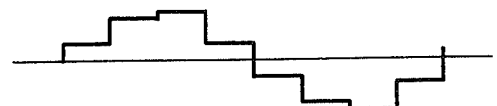
Figure 3C:
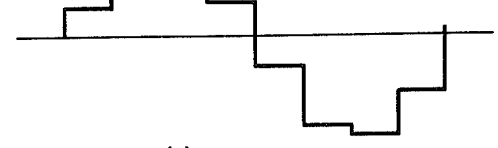

The discrete signal having the waveform shown in FIG. 3b is equalized and amplified by the equalizer 13 to normal levels in such a manner as controlled by sampled values. Thus, an equalized signal having a waveform such as shown in FIG. 3c is outputted from the equalizer 13.

Figure 3D:
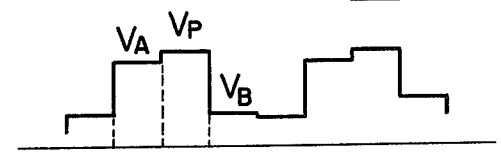

The equalized signal is full-wave rectified by the full-wave rectifying circuit 14 to form a waveform such as shown in FIG. 3d. A difference ($V_A - V_B$) between, for example, voltages $V_A$ and $V_B$ which appear before and after a peak voltage $V_P$ of the waveform shown in FIG. 3d, is detected by the voltage difference detecting circuit 15, and the oscillation frequency of the voltage controlled oscillator 16 is controlled by the output of the detecting circuit 15.

The oscillation frequency of the voltage controlled oscillator 16, namely, the sampling frequency is varied in accordance with the output of the detecting circuit 15 so that the output of the detecting circuit 15 is equal to zero.

Such an operation can be performed when a range, in which the oscillation frequency of the oscillator 16 can be varied, includes a frequency which is N times higher than the clock frequency of the input data signal, and the loop gain of the sample and hold circuit 12, equalizer 13, full-wave rectifying circuit 14, voltage difference detecting circuit 15 and voltage controlled oscillator is made sufficiently large.

At this time, the output signal of the voltage controlled oscillator 16 is synchronized with a signal having a frequency which is N times higher than the clock frequency with respect to the input data signal.

That is, the latter signal has a steplike waveform such that a difference between amplitudes (namely, the above-mentioned $V_A$ and $V_B$) appearing before and after the time when the sampled data signal has a maximum amplitude (namely, the above-mentioned $V_P$) is equal to zero.

Accordingly, when the input data signal has a waveform which is symmetrical with respect to a peak position, the maximum amplitude of the above-mentioned signal having the steplike waveform corresponds to the peak value of the input data signal, and the maximum amplitude portion of the steplike signal is synchronized with a peak position of the input data signal.

Figure 3E:
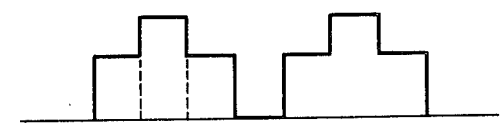

In conclusion, the output of the full-wave rectifying circuit 14 is corrected so as to have such a steplike waveform as shown in FIG. 3e. In this waveform, the maximum amplitude portion is synchronized with the peak portion of the input data signal, and the difference in amplitude between portions existing before and after the maximum amplitude portion is equal to zero.

On the other hand, the phase-of-peak determining circuit 17 takes in the output signal of the voltage controlled oscillator 16, and determines the phase of the peak in the input data signal by processing phase information contained in the output signal of the oscillator 16 to send information with respect to the phase of the peak to the discriminating circuit 18.

Figure 3F:

The discriminating circuit 18 discriminates the maximum amplitude portion of the steplike waveform shown in FIG. 3e from other portions on the basis of the above-mentioned information with respect to the phase of the peak, and sends out such a reproduced clock signal as indicated by reference characters CLK1 and CLK2 in FIG. 3f, from the output terminal 19 in accordance with the discriminated maximum amplitude portion.

Although the full-wave rectifying circuit 14 is employed in the present invention, it may be replaced by a half-wave rectifying circuit. In this case, it is impossible to extract information contained in that portion of the input data signal which corresponds to a positive or negative half cycle, and therefore some jitter appears on the reproduced clock signal. Accordingly, there is a fear of the fidelity in clock signal reproduction being lowered. When the jitter does not cause any trouble for practical purposes, the half-wave rectifying circuit can be put to practical use.

Figure 4:
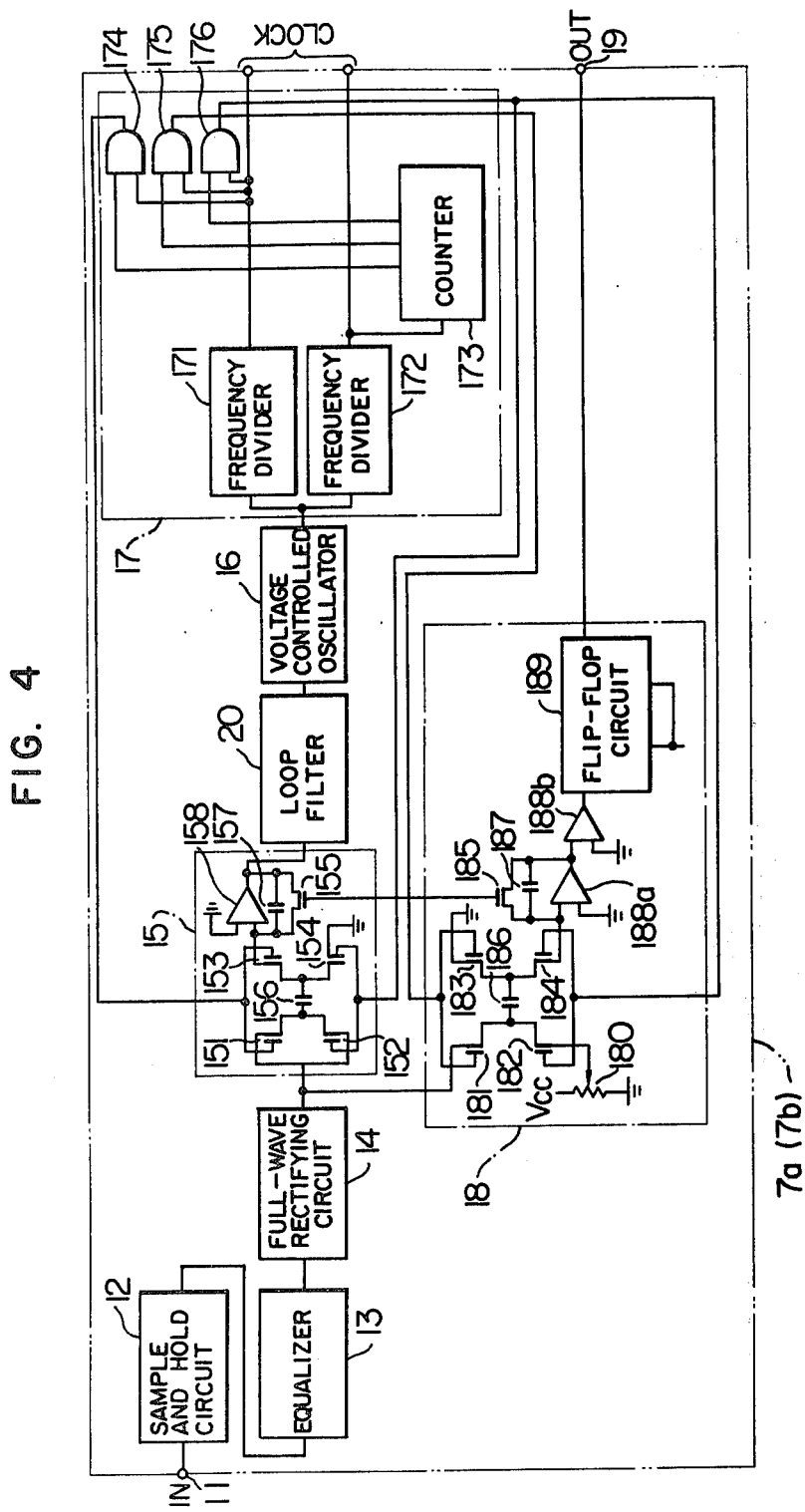
FIG. 4 is a circuit diagram showing a concrete circuit confirguration of a portion of the embodiment shown in FIG. 2.

FIG. 4 shows an example of a circuit configuration of the voltage difference detecting circuit 15, phase-of-peak determining circuit 17 and discriminating circuit 18 which are included in the clock extracting/reproducing part 9 and the equalizing, discriminating and reproducing part 10. In FIG. 4, reference numeal 20 designates a loop filter.

Referring to FIG. 4, the voltage difference detecting circuit 15 includes a difference voltage detecting circuit which is made up of four MOSFET's 151 to 154 for selection and a capacitor 156, that is, formed of the so-called switched capacitor, and an integrating circuit which is made up of an MOSFET 155, a capacitor 157 and an operational amplifier 158, to send a difference voltage between the above-mentioned voltages $V_A$ and $V_B$ to the voltage controlled oscillator 16 through the loop filter 20. The phase-of-peak determining circuit 17 includes frequency dividers 171 and 172 for dividing down the oscillation frequency of the voltage controlled oscillator 16, a counter 173 and AND circuits 174 to 176, and delivers clock signals for use in the sampling operation and others. Further, the discriminating circuit 18 includes a circuit for discrminating between positive and negative values, an integrating circuit, a comparator formed of an operational amplifier 188b and a flip-flop circuit 189, to send the reproduced clock signal to the output terminal 19. The circuit for discriminating between positive and negative values is made up of a potentiometer 180 for setting a threshold value, MOSFET's 181 to 184 and a capacitor 186, and the integrating circuit is made up of an MOSFET 185, a capacitor 187 and an operational amplifier 188a.

Further, the voltage controlled oscillator 16 and the loop filter 20 can take the form of a digital PLL, in the case where the loop filter 20 is replaced by a counter, where the oscillation frequency of the voltage controlled oscillator 16 is made n times higher than an input frequency (where n lies in a range from 50 to 60), and where the frequency dividers generate frequencies equal to $1/(n-1)$, $1/n$ and $1/(n+1)$ of the output frequency of the oscillator 16.

As has been explained in detail in the foregoing description, according to the present invention, it is unnecessary to use such a complicated circuit configuration as in a conventional clock signal extracting circuit provided with a number of coil parts and to make circuit adjustment, and therefore a clock signal extracting circuit can be obtained which is economical, has an excellent performance, and is small in size.

Further, a clock signal extracting circuit according to the present invention, which adopts the sampled value control system, can be coupled with other devices in a digital communication system without any particular difficulty. Accordingly, the clock signal extracting circuit and the devices can be united in an integrated circuit, and thus the whole of the communication system can be made small in size and inexpensive.

What is claimed is:

1. A clock signal extracting circuit comprising:
   means for sampling and holding an input data signal in accordance with a predetermined sampling frequency to produce a train of sampled values;
   means for supplying a signal at said sampling frequency to said sampling and holding means to control the timing of said sampling and holding operation;
   means for subjecting the train of sampled values from said sampling and holding means to equalization and amplification;
   means connected to receive the equalized and amplified train of sampled values from said equalization and amplification means for extracting and reproducing a clock signal therefrom;
   means connected between said equalization and amplification means and said extracting and reproducing means for detecting a difference in voltage amplitude between a pair of those values of the equalized and amplified train of sampled values which appear immediately before and after the time when the sampled-value train has a peak value;
   means for controlling said sampling frequency supplied from said sampling frequency supplying means to said sampling and holding means in accordance with the output of said difference voltage detecting means so that said difference voltage is made zero, thereby providing a clock signal frequency-synchronized with said input data signal as said clock signal from said extracting and reproducing means; and
   means connected to receive an output of said sampling frequency supplying means varying in accordance with the output of said difference voltage detecting means for determining the phase of said input data signal at which a peak of said input data signal is to appear, said phase determining means including means for applying information of the phase of said peak to said extracting and reproducing means so that said clock signal from said extracting and reproducing means is produced as a signal phase-synchronized with the peak of said input data signal.

2. A clock signal extracting circuit comprising:
   a sample and hold circuit for sampling and holding an input data signal in accordance with a predetermined sampling frequency;
   a equalizer for subjecting a steplike waveform to equalization and amplification, said steplike waveform being outputted from said sample and hold circuit;
   a rectifying circuit for rectifying the output of said equalizer;
   a voltage difference detecting circuit for detecting an amplitude difference voltage in a steplike waveform outputted from said rectifying circuit;
   a voltage controlled oscillator controlled by the output of said voltage difference detecting circuit for varying said sampling frequency;
   a phase-of-peak determining circuit applied with the output of said voltage controlled oscillator for determining a phase in said input data signal, a peak of said input data signal appearing at said phase, said phase-of-peak determining circuit outputting information with respect to said phase of said peak; and
   a discriminating circuit for discriminating a peak portion of said steplike waveform outputted from said rectifying circuit from other portions of said steplike waveform on the basis of said information with respect to said phase of said peak, to output a reproduced clock signal.

3. A clock signal extracting circuit according to claim 2, wherein said rectifying circuit is a full-wave rectifying circuit.

4. A clock signal extracting circuit according to claim 2, wherein said voltage difference detecting circuit includes a difference detecting circuit which is made up of an MOSFET and a capacitor, and an integrating circuit which is made up of an MOSFET, a capacitor and an operational amplifier.

5. A clock signal extracting circuit according to claim 2, wherein said phase-of-peak determining circuit includes a frequency divider, a counter and an AND circuit.

6. A clock signal extracting circuit according to claim 2, wherein said discriminating circuit includes a circuit for discrminating between positive and negative values, an integrating circuit, a comparator and a flip-flop circuit, wherein said circuit for discriminating between positive and negative values is made up of an MOSFET, a capacitor and a potentiometer for setting a threshold value, and wherein said integrating circuit is made up of an MOSFET, a capacitor and an operational amplifier.

* * * * *